United States Patent
Konishi et al.

(10) Patent No.: US 6,300,043 B1
(45) Date of Patent: Oct. 9, 2001

(54) METHOD OF FORMING RESIST FILM

(75) Inventors: Nobuo Konishi, Yamanashi-ken; Keizo Hirose, Kofu, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/200,742

(22) Filed: Nov. 30, 1998

(30) Foreign Application Priority Data

Dec. 4, 1997 (JP) ................................................ 9-352371

(51) Int. Cl.$^7$ ........................................................ G03F 7/00
(52) U.S. Cl. ............................ 430/327; 430/322; 430/324
(58) Field of Search .................................. 430/327, 311, 430/331, 322, 324; 134/1–3

(56) References Cited

U.S. PATENT DOCUMENTS

| | | | | |
|---|---|---|---|---|
| Re. 35,821 | * | 6/1998 | Niki et al. ............................. | 430/326 |
| 3,793,106 | * | 2/1974 | Grunwald et al. .................... | 156/155 |
| 4,861,438 | * | 8/1989 | Banks et al. .......................... | 204/15 |
| 5,002,008 | | 3/1991 | Ushijima et al. .................... | 118/313 |
| 5,145,764 | * | 9/1992 | Bauer et al. .......................... | 430/260 |
| 5,149,615 | * | 9/1992 | Chakravorty et al. ............... | 430/313 |
| 5,198,326 | * | 3/1993 | Hashimoto et al. ................. | 430/296 |
| 5,238,554 | * | 8/1993 | Banks ................................... | 205/125 |
| 5,316,894 | * | 5/1994 | Takahashi et al. ................... | 430/313 |
| 5,458,985 | * | 10/1995 | Isono et al. ........................... | 428/601 |
| 5,637,426 | * | 6/1997 | Ichikawa .............................. | 430/9 |
| 5,665,200 | | 9/1997 | Fujimoto et al. .................... | 438/694 |
| 5,688,322 | | 11/1997 | Motoda et al. ....................... | 118/52 |
| 5,763,142 | * | 6/1998 | Iwasa ................................... | 430/322 |
| 5,786,275 | * | 7/1998 | Kubo .................................... | 438/692 |
| 5,814,432 | * | 9/1998 | Kobayashi ........................... | 430/312 |
| 5,853,803 | * | 12/1998 | Tateyama et al. ................... | 427/240 |
| 5,854,133 | * | 12/1998 | Hachiya et al. ...................... | 438/692 |
| 5,874,202 | * | 2/1999 | Orth ..................................... | 430/327 |
| 5,905,019 | * | 5/1999 | Obszarny ............................. | 430/327 |
| 5,906,911 | * | 5/1999 | Cote ..................................... | 430/316 |
| 5,922,515 | * | 6/1999 | Chiang et al. ....................... | 430/312 |
| 5,922,517 | * | 7/1999 | Bhatt et al. .......................... | 430/315 |
| 5,949,927 | * | 9/1999 | Tang ..................................... | 385/12 |
| 6,001,542 | * | 12/1999 | Orth ..................................... | 430/327 |
| 6,004,047 | * | 12/1999 | Akimoto et al. .................... | 396/604 |
| 6,063,547 | * | 5/2000 | Ye et al. ............................... | 430/313 |
| 6,143,478 | * | 11/2000 | Toshima et al. ..................... | 430/330 |

* cited by examiner

Primary Examiner—Kathleen Duda
(74) Attorney, Agent, or Firm—Oblon, Spivak, McClelland, Maier & Neustadt, P.C.

(57) ABSTRACT

A method of forming a resist film comprises (a) forming a resist film on a substrate, and (b) removing a surface region of the resist film formed in the step (a) so as to decrease the thickness of the resist film.

16 Claims, 9 Drawing Sheets

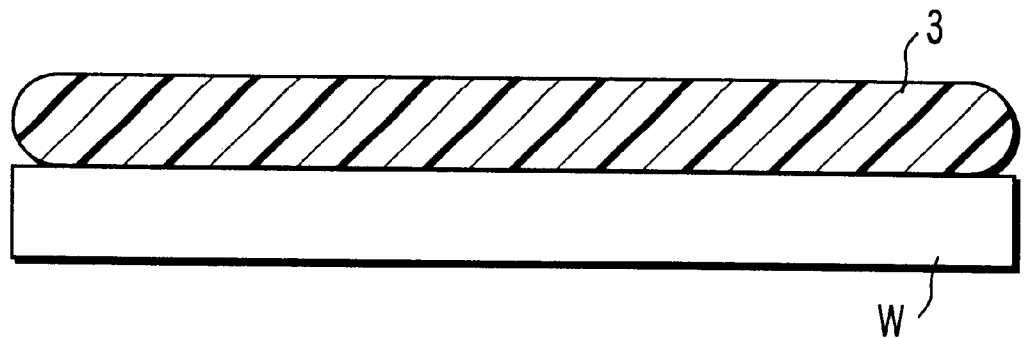
F I G. 9A
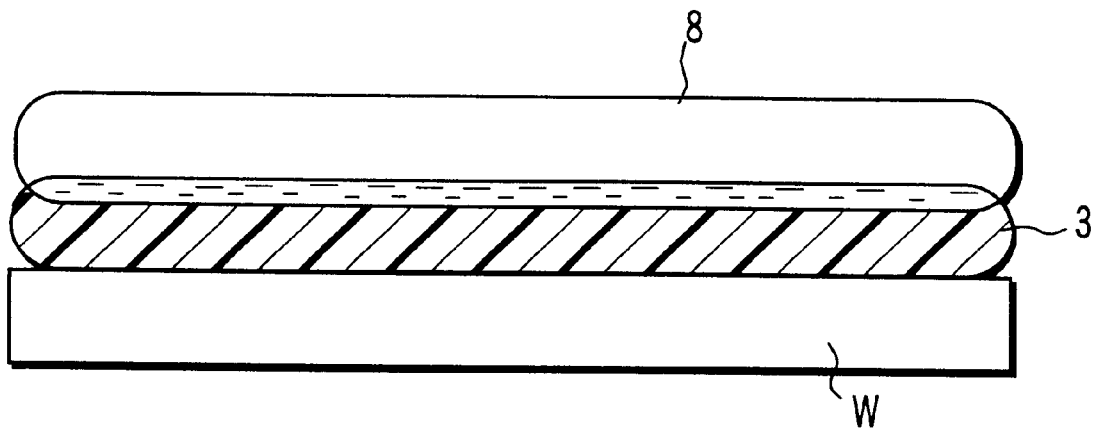
F I G. 9B
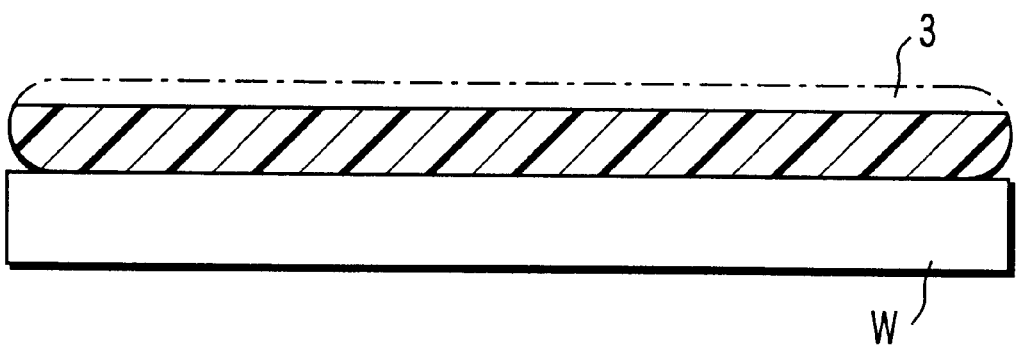
F I G. 9C

METHOD OF FORMING RESIST FILM

BACKGROUND OF THE INVENTION

The present invention relates to a method of forming a resist film on a surface of the substrate or on a layer formed on a substrate such as a semiconductor layer, an insulating layer or an electrode layer.

In a photolithography process, a photoresist film is formed on a semiconductor wafer or a glass substrate for a liquid crystal display device (LCD substrate), followed by exposing the photoresist film to light in a predetermined pattern and subsequently developing the patterned photoresist film. Where the photoresist film is formed on the substrate, employed is a spin coating method disclosed in, for example, U.S. Pat. No. 5,002,008 or U.S. Pat. No. 5,688,322.

In recent years, the semiconductor wafer or the LCD substrate tends to be enlarged, with the line width of the circuit pattern becoming finer and finer. As a result, the photoresist film is required to be made thinner. The wafer size and the pattern line width have undergone various changes in the manufacture of a semiconductor device. Specifically, the pattern line width was 0.5 to 0.8 $\mu$m in a 6-inch wafer. In this case, the corresponding resist film was about 1.0 $\mu$m thick. Also, the pattern line width was 0.3 to 0.2 $\mu$m in an 8-inch wafer. In this case, the corresponding resist film was about 0.8 to 1.0 $\mu$m thick. Further, the pattern line width was 0.18 to 0.22 $\mu$m in a 12-inch wafer. In this case, the corresponding resist film is considered to be about 0.3 to 0.5 $\mu$m thick.

The thickness of the resist film formed by the spin coating method is greatly dependent on the rotating speed of the substrate and on the viscosity (concentration and temperature) of the resist solution. In order to make the resist film thinner, it is necessary to lower the viscosity of the resist solution and to increase the rotating speed of the substrate. For example, with change in the wafer diameter from 6 inches to 8 inches, the viscosity of the resist solution is lowered from 10 cP to 5 cP. Also, the wafer rotating speed is increased from, for example, 2,000 rpm to 3,000 rpm.

In a 12-inch wafer which is expected to be put to a practical use in future, the thickness of the resist film is to be decreased to below 0.5 $\mu$m, making it necessary to further lower the viscosity of the resist solution and to further increase the wafer rotation speed. However, the lowest viscosity of the resist solution which can be used in the manufacture of a semiconductor device is about 3 cP. In order to form a resist film in a thickness of about 0.5 $\mu$m by using a resist solution having a viscosity of about 3 cP, it is necessary to set the wafer rotation speed at about 4,000 rpm. However, the resist film formed by a spin coating method with such a high rotation speed is greatly non-uniform in thickness. Also, an excessively large load is applied to the spin chuck driving mechanism for rotating a large substrate at such a high speed, with the result that the spin chuck driving mechanism is required to be put to maintenance frequently. It follows that it is difficult to carry out a stable treatment uniformly.

BRIEF SUMMARY OF THE INVENTION

An object of the present invention is to provide a method of forming a resist film having a small thickness.

According to a first aspect of the present invention, there is provided a method of forming a resist film, comprising, the steps of, (a) forming a resist film on a substrate, and (b) removing a surface region of the resist film formed in the step (a) so as to decrease the thickness of the resist film.

In the step (b), an acid component is applied to the surface of the resist film so as to make the surface region of the resist film soluble in alkali, followed by applying an alkaline solution to the surface of the resist film so as to permit the surface region of the resist film to be dissolved in the alkaline solution and, thus, to remove the surface region. It is desirable to use an aqueous solution containing a compound having a sulfonic group as the acid component.

In the step (a), the substrate is coated with a resist solution containing a first solvent, followed by heating the resist film so as to evaporate the first solvent from the resist film. Then, in the step (b), a second solvent lower in its dissolving characteristics than the first solvent is supplied to the surface of the resist film so as to permit the surface region of the resist film to be dissolved in the second solvent and, thus, to remove the surface region. It is desirable to use a mixture consisting of 85% by volume of isopropyl alcohol and 15% by volume of MMP (3-methoxymethyl propionate) as the solvent having the low dissolving characteristics.

In the step (b), it is possible to apply a mechanochemical polishing treatment to the surface of the resist film for removing the surface region of the resist film. In performing the mechanochemical polishing treatment, a polishing member is brought into contact with the surface of the resist film while supplying a chemical polishing agent onto the surface of the resist film, and the polishing member is moved relative to the substrate. It is desirable for the polishing member to be formed of polyurethane. Also, it is desirable to supply, for example, a colloidal silica, which is a weakly alkaline slurry containing silica as a main component, as the polishing agent.

In the step (a), it is possible to supply a resist solution onto the substrate while rotating the substrate. Also, in the step (b), it is possible to supply a liquid material containing the acid component onto the substrate while rotating the substrate. It is also possible to supply in the step (b) a solvent having a low dissolving power onto the substrate while rotating the substrate. Each of the resist solution, the acid component solution, the solvent and the chemical polishing agent can be dispersed uniformly over the entire surface of the substrate by employing a spin coating method so as to ensure uniformity of processing.

In the step (a), an alkali-reactive group brings about an acid catalyst reaction under heat, making it possible to coat the substrate with a chemically amplified resist in which the portion where the acid catalyst reaction has taken place is made soluble in alkali. It is possible to use as the chemical amplification type resist polyhydroxy styrene (PHS) having an acetal protective group (see FIG. 7), PHS having t-BOC protective group or polyvinyl phenol having the hydroxyl group within the polymer blocked by an alkyl group.

According to a second aspect of the present invention, there is provided a method of forming a resist film, comprising:

a first step of forming on a surface of a substrate a chemically amplified resist film, which, if heated in the presence of an acid component, permits the acid component to be diffused so as to bring about an acid catalyst reaction, the portion where the acid catalyst reaction has taken place being made soluble in alkali;

a second step of supplying the acid component to the surface of the resist film after the first step;

a third step of heating the substrate so as to cause the acid component to bring about an acid catalyst reaction within the resist film to make the surface region of the resist film soluble in alkali; and a fourth step of supplying an alkaline solution onto the surface of the substrate so as to dissolve and remove the surface region of the resist film.

The thickness of the resist film can be decreased to a desired level by repeating a plurality of times the second to fourth steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A to 9C are cross sectional views schematically showing the resist film forming method according to the second embodiment of the present invention;

DETAILED DESCRIPTION OF THE INVENTION

Let us describe preferred embodiments of the present invention with reference to the accompanying drawings.

Figure 1:
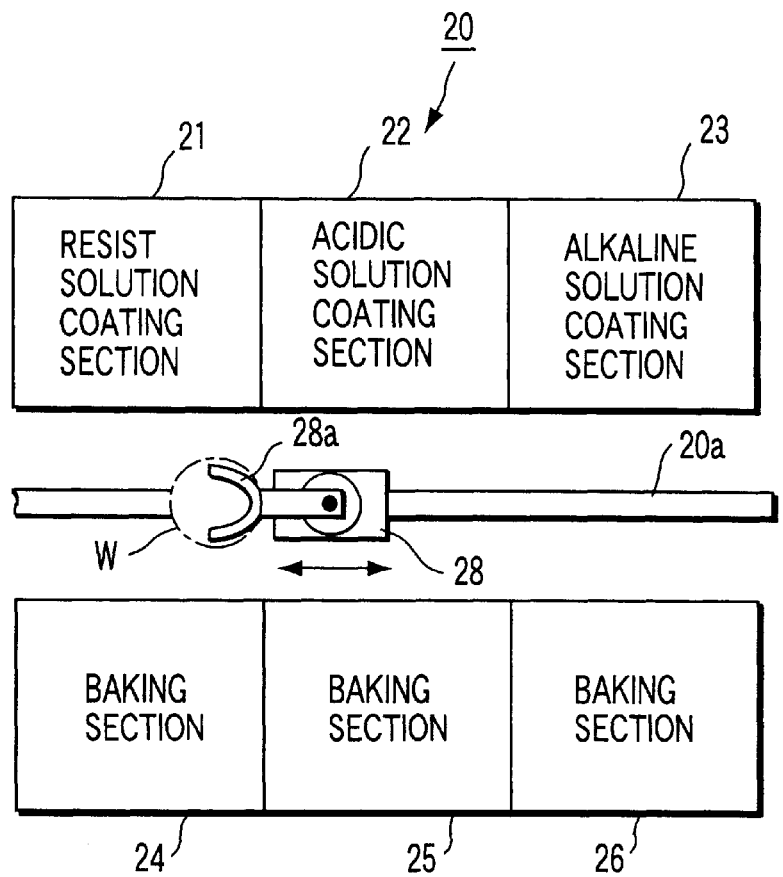
FIG. 1 is a plan view schematically showing the entire resist processing system.

As shown in FIG. 1, a plurality of treating sections are arranged in a process section 20 of a resist processing system. A transfer path 20a is formed in a central portion of the process section 20, and a main transfer arm 28 is arranged movable along the transfer path 20a. The main transfer arm 28 comprises a holder 28a, a back-and-forth moving mechanism for moving the holder 28a back and forth, a Y-axis driving mechanism for moving the holder 28a along the transfer path 20a, a Z-axis driving mechanism for vertically moving the holder 28a, and a θ-driving mechanism for swinging the holder 28a about a Z-axis. The main transfer arm 28 serves to transfer semiconductor wafers W one by one into treating sections 21 to 26.

A load/unload section (not shown) is arranged adjacent to the process section 20. A plurality of wafer cassettes are transferred by a transfer robot(not shown) into the load/unload section. A sub-transfer arm (not shown) is mounted to the load/unload section to take semiconductor wafers W from the wafer cassette and, then, to deliver the wafers W onto the main transfer arm 28.

Arranged on one side of the transfer path 20a are a resist solution coating section 21, an acidic solution coating section 22, and an alkaline solution coating section 23. On the other hand, arranged on the other side of the transfer path 20a are three baking sections 24, 25 and 26. Further, an adhesion treating section (not shown), a cooling section (not shown), a washing section (not shown), etc. are included in the process section 20.

Figure 2:
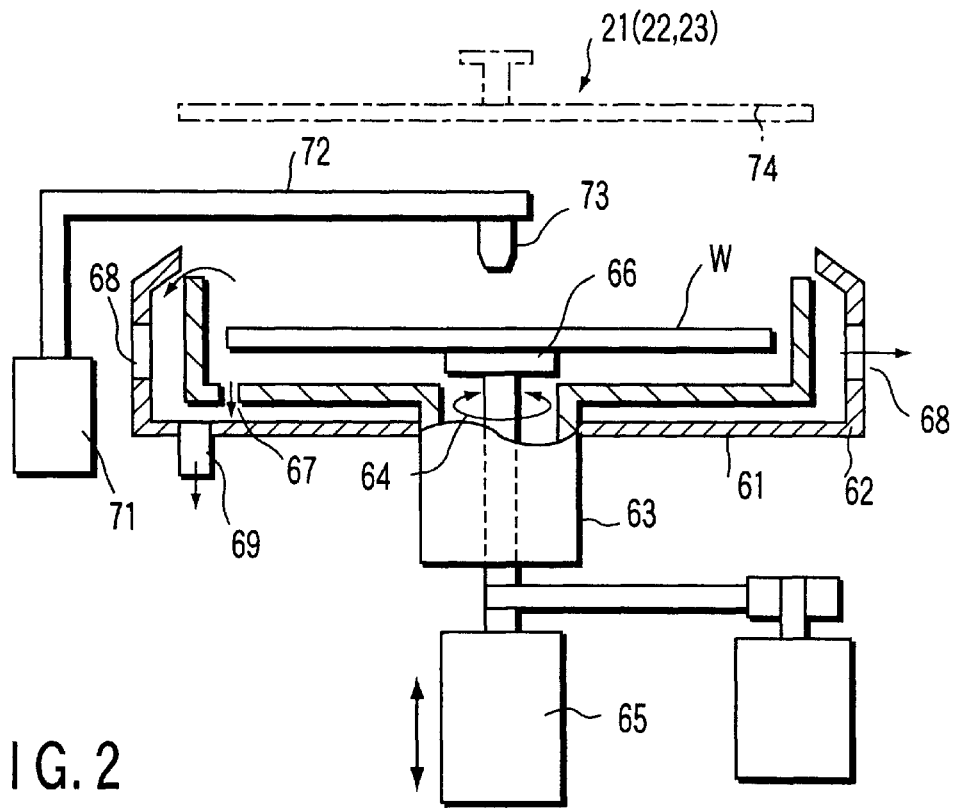
FIG. 2 is a cross sectional view schematically showing a resist coating section.

As shown in FIG. 2, the resist solution coating section 21 includes a spin chuck 66, an inner cup 61, an outer cup 62, and a nozzle 73. The spin chuck 66 is arranged within the inner cup 61 and is provided with a driving mechanism (not shown) for rotating the spin chuck, a vacuum suction mechanism (not shown), and a vertical cylinder mechanism 65. The exhaust passageway of the vacuum suction mechanism is formed within a rotary shaft 64 so as to be open at the upper surface of the spin chuck 66.

A cylindrical portion 63 is mounted to a lower portion of the inner cup 61. Also, a belt (not shown) is stretched between the cylindrical portion 63 and a motor (not shown) such that the inner cup 61 is rotated by the motor. The inner cup 61 is covered with a lid 74 which is supported vertically movable by a lift mechanism (not shown). If the lid 74 is moved downward, the upper opening of the inner cup 61 is closed by the lid 74.

The outer cup 62 is mounted to surround the inner cup 61. An exhaust port 68 communicating with an exhaust apparatus (not shown) is formed in an outer circumferential region of the outer cup 62. Mist of the process solution released through a hole 67 made in the inner cup 61 is discharged to the outside through the exhaust port 68. Also, a drain passageway 69 is formed in a bottom portion of the outer cup 62. The process solution discharged through the hole 67 of the inner cup 61 is discharged to the outside through the drain passageway 69.

A nozzle 73 is mounted to a tip portion of a horizontal arm 72 which is driven by a driving section 71 so as to be swung between a home position outward of the cups 61, 62 and an operating position above the center of rotation of the spin chuck 66. The driving section 71 comprises a swinging mechanism for swinging the horizontal arm 72 about a vertical shaft and a lift mechanism for vertically moving the horizontal arm 72. The nozzle 73 is provided with a temperature control mechanism (not shown) and communicates with a resist supply source (not shown). The resist supply source is provided with a mechanism for controlling the resist concentration, a mechanism for controlling the resist temperature, and a mechanism for controlling the supply rate of the resist solution.

Figure 4:
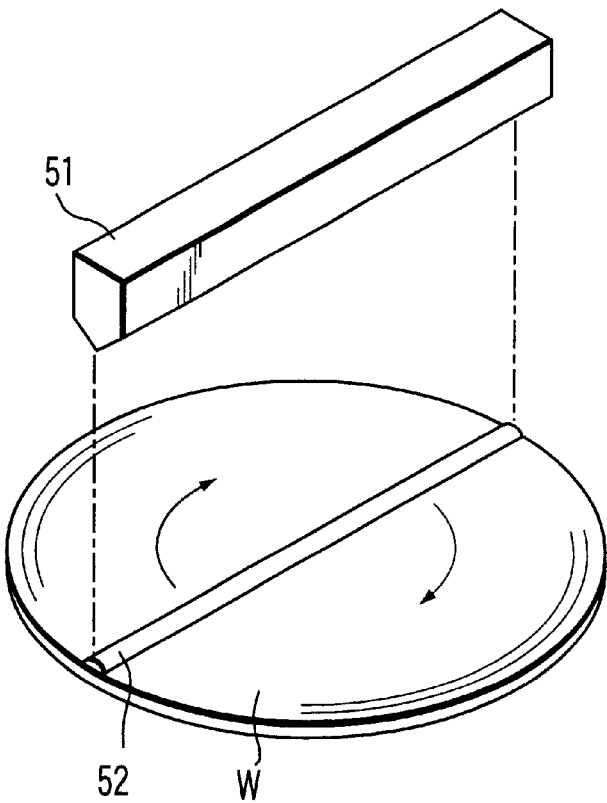
FIG. 4 is an oblique view schematically showing another resist coating section.

Each of the acidic solution coating section 22 and the alkaline solution coating section 23 is substantially equal in construction to the resist solution coating section 21. However, in the alkaline solution coating section 23, it is possible to use a linear nozzle 51 shown in FIG. 4 in place of the nozzle 73. The liquid discharge region of the linear nozzle 51 has a length substantially equal to the diameter of the wafer W. A large number of fine holes are arranged in the liquid discharge region of the linear nozzle 51. With the liquid discharge region of the linear nozzle 51 positioned about 1 mm apart from the surface of the wafer W, an alkaline solution is spurted from the linear nozzle 51 against the wafer W while rotating the wafer W at a low speed so as to form an upheaved portion 52 of the alkaline solution on the surface of the wafer W.

Figure 3:
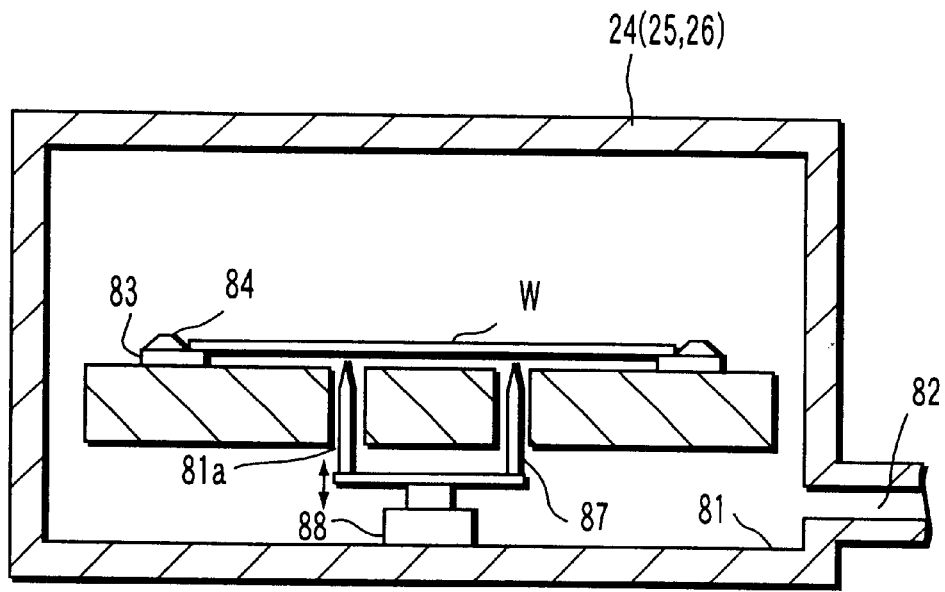
FIG. 3 schematically shows a baking section.

As shown in FIG. 3, a hot plate 81 is arranged within a chamber 80 of each of the baking sections 24, 25 and 26. A periphery supporting member 83 and a guide member 84 are mounted on the upper surface of the hot plate 81. The wafer W is supported by these members 83 and 84 close to, but not in contact with, the hot plate 81. A lift mechanism 81 for vertically moving three pins 87 is arranged below the hot plate 81. Each pin 87 is inserted into a through-hole 81a made in the hot plate 81. If moved upward by the lift mechanism 88, the pins 87 project upward from the upper surface of the hot plate 81 so as to move upward the wafer W. Incidentally, a clean air inlet port (not shown) is formed in an upper portion of the chamber 80. Also, an outlet port 82 is formed in a lower portion of the chamber 80. As a result, a downstream of a clean air is formed within the chamber 80.

Figure 5:
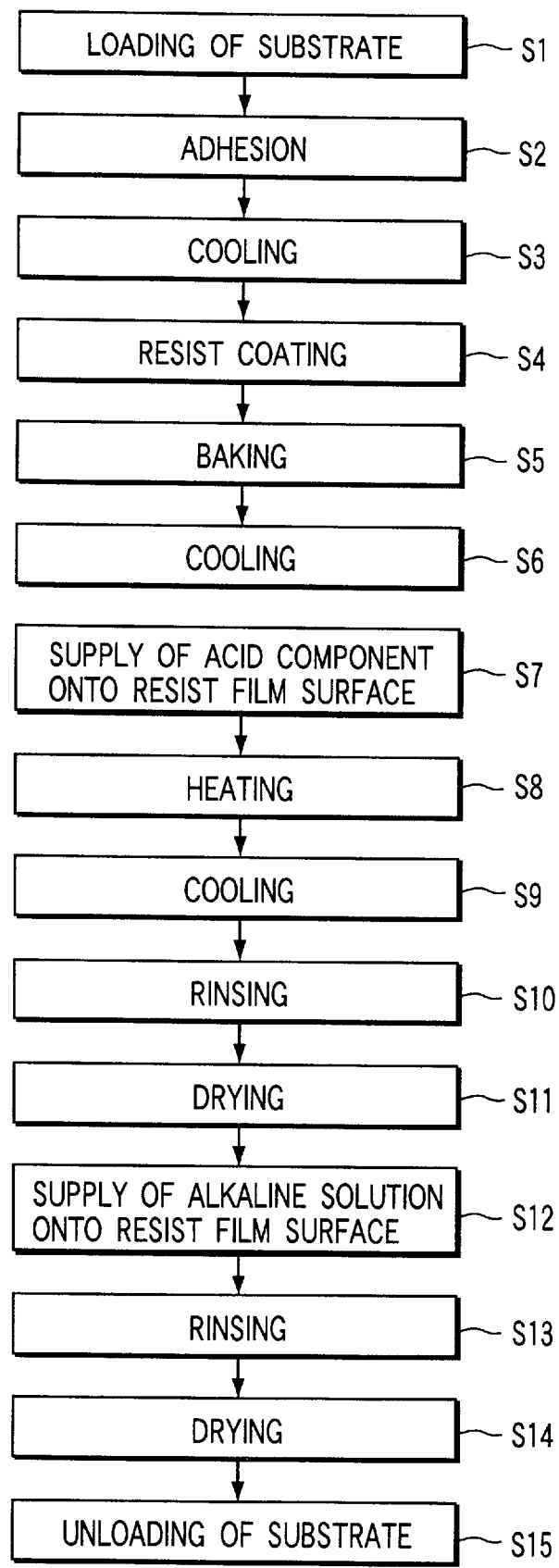
FIG. 5 is a flow chart showing a resist film forming method according to a first embodiment of the present invention.
Figure 6A:
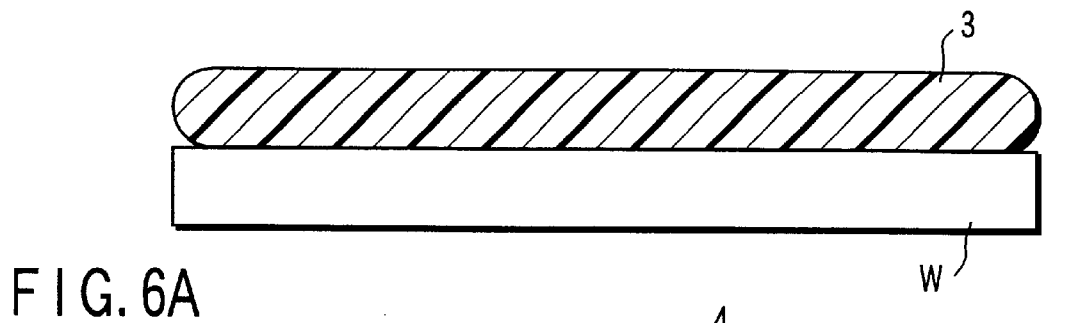
FIGS. 6A to 6E are cross sectional views schematically showing a resist film forming method according to the first embodiment of the present invention.
Figure 6B:
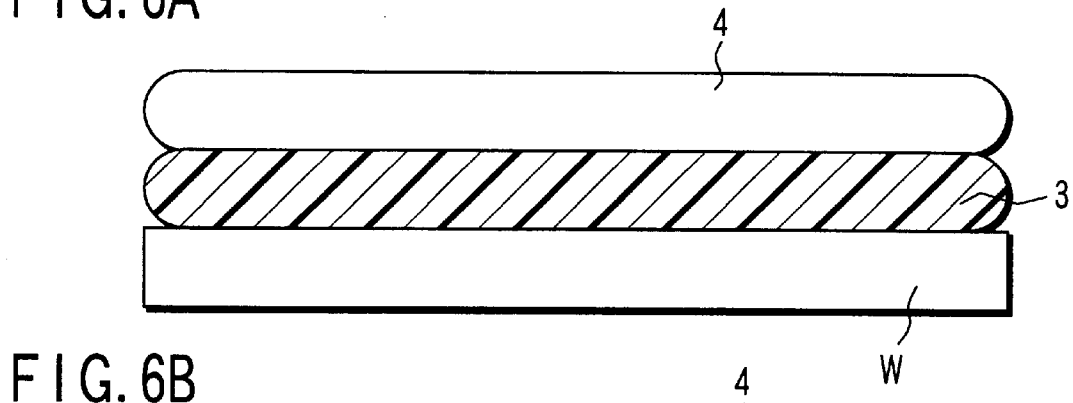
Figure 6C:
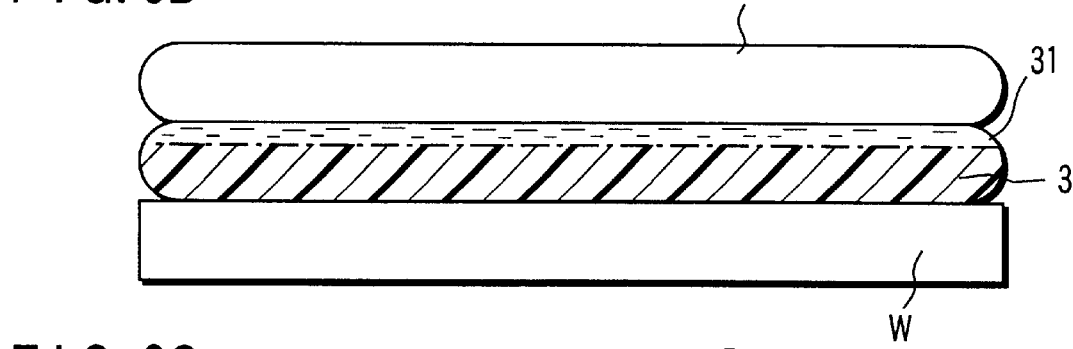
Figure 6D:
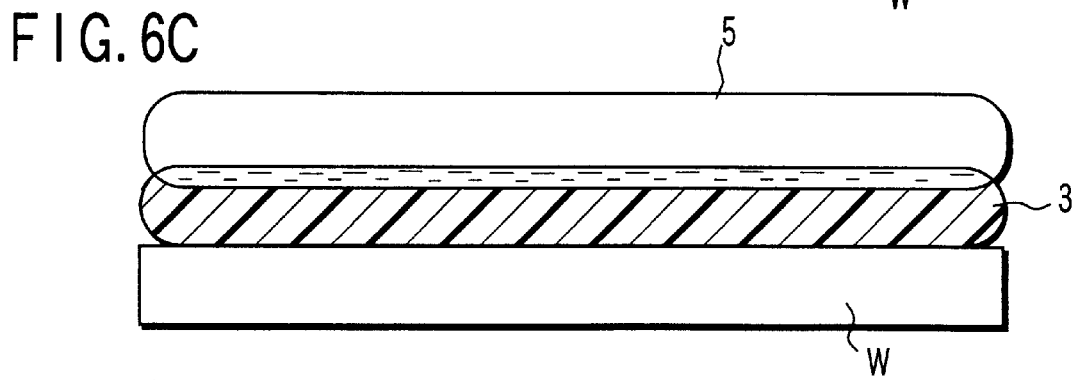
Figure 6E:
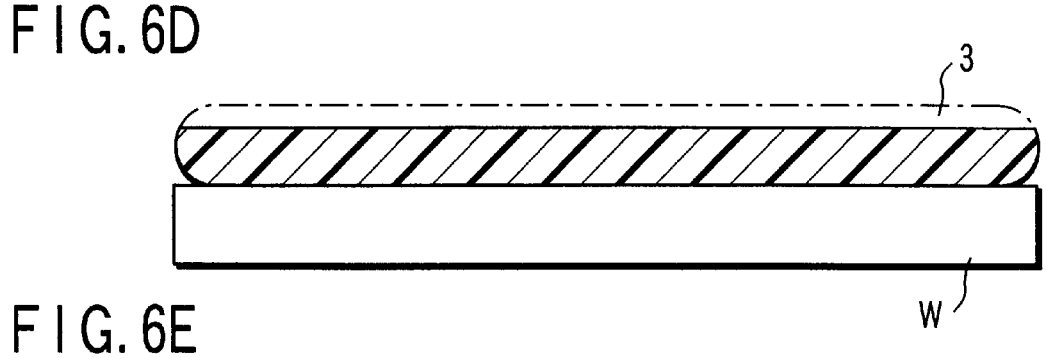
Figure 7:
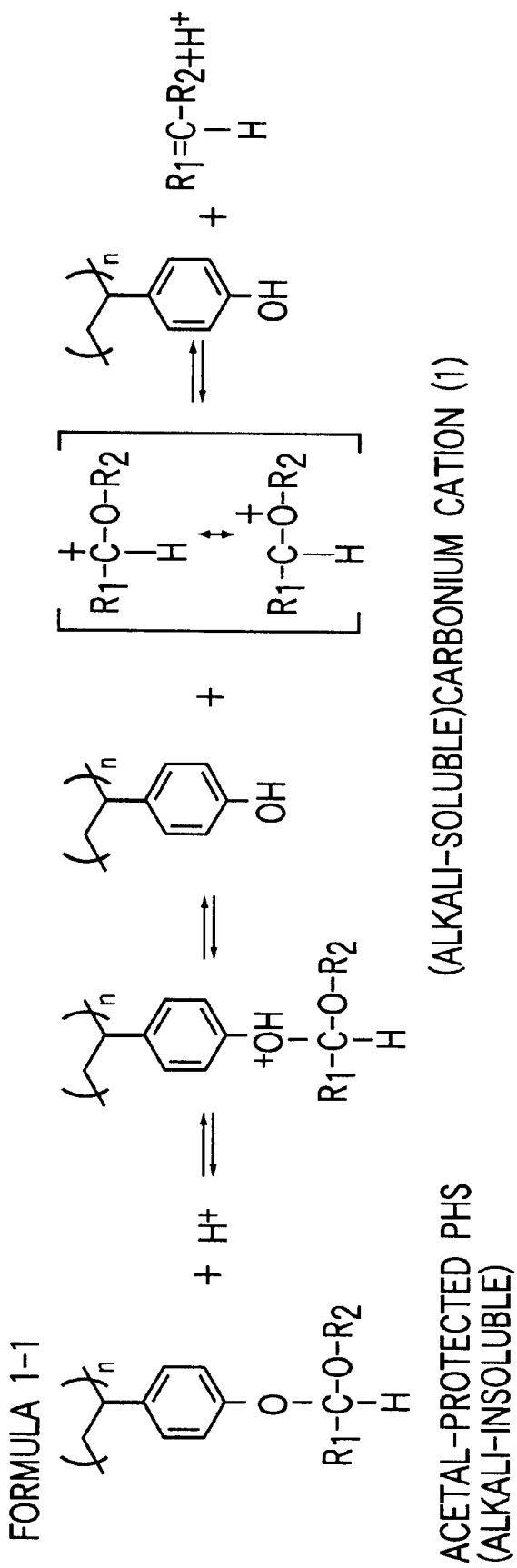
FIG. 7 shows a chemical reaction formula for making the resist soluble in alkali.
Figure 8:
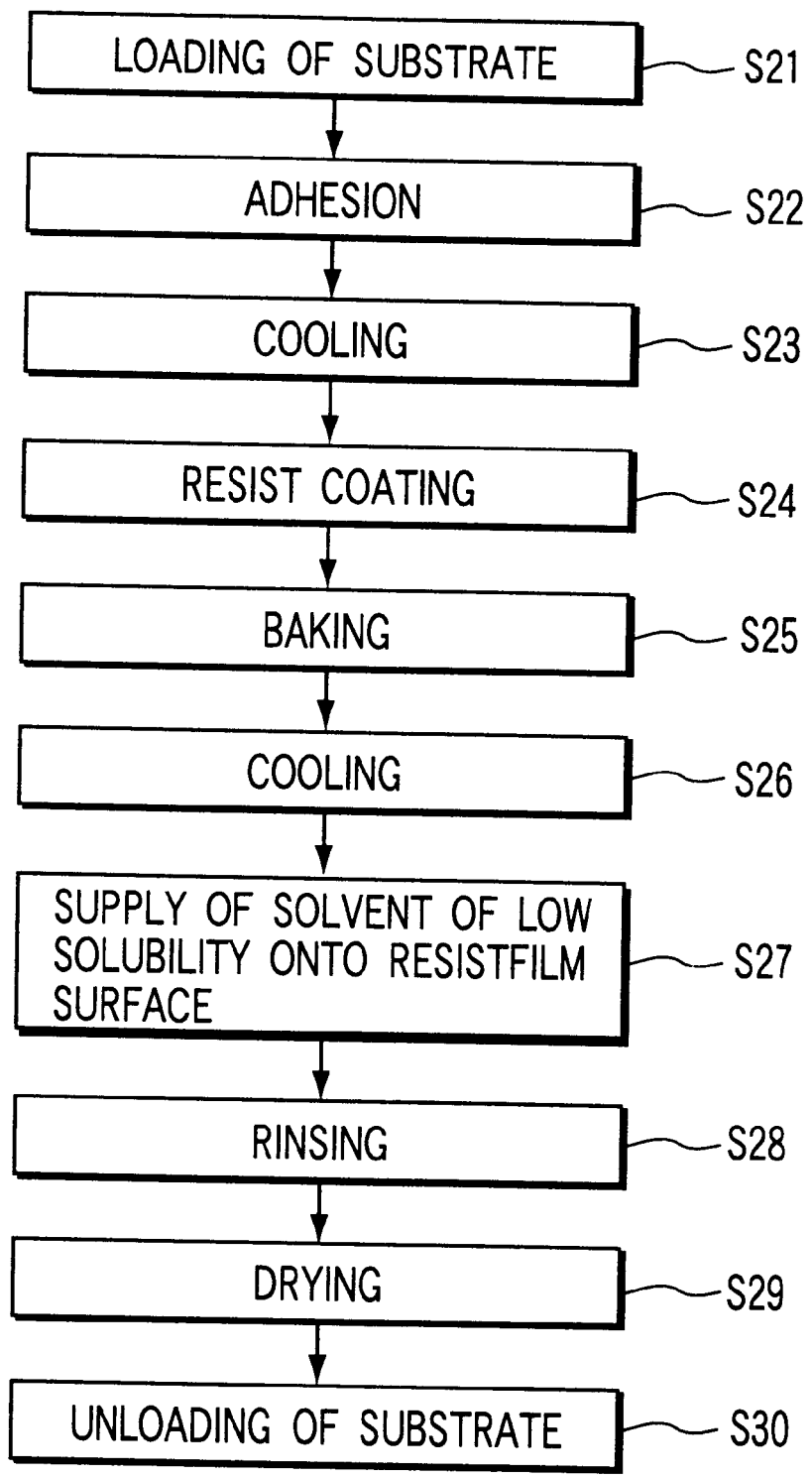
FIG. 8 is a flow chart showing a resist film forming method according to a second embodiment of the present invention.

Let us describe a first embodiment of the present invention with reference to FIGS. 5 to 7.

In the first step, a wafer W is taken out of a cassette (not shown) by the sub-arm mechanism (not shown) and, then, delivered to the main transfer arm 28. Further, the wafer W is transferred by the main transfer arm 28 into the chamber of an adhesion treating section (not shown) included in the process section 20 (step Si). In the adhesion treating section, a vapor of hexamethyl disilazane (HMDS) is introduced into the chamber, and HMDS is allowed to act under heat on the surface of the wafer W so as to make the surface of the wafer W hydrophobic (step S2). Further, the main transfer arm 28 transfers the wafer W into a cooling section (not shown) so as to cool the wafer W to about room temperature (step S3).

Then, the wafer W is transferred by the main transfer arm 28 into the resist solution coating section 21. If a shutter (not shown) of the resist solution coating section 21 is opened so as to transfer the wafer W together with the holder 28a into the resist solution coating section 21, the spin chuck 66 is moved upward so as to permit the wafer W to be delivered from the holder 28a onto the spin chuck 66. Then, the holder 28a is retreated and the shutter is closed so as to permit the wafer W to be held by vacuum suction by the spin chuck 66. Under this condition, the spin chuck 66 holding the wafer W is moved downward into the inner cup 61.

Then, the nozzle 73 is swung from the home position to the operating position. Under this condition, the resist solution is supplied at a predetermined rate from the nozzle 73 toward the center of rotation of the wafer W. After supply of the resist solution, the nozzle 73 is swung again to the home position, followed by moving the lid 74 downward so as to be disposed on the cups 61 and 62 and, thus, to close the inner spaces of the cups 61, 62. Then, the wafer W is rotated at a predetermined speed while exhausting the inner spaces of the cups 61, 62 so as to permit the resist solution to be diffused on the wafer W. As a result, a resist film 3 of a uniform thickness is formed on the surface of the wafer W, as shown in FIG. 6A (step S4). The target value in the average thickness of the resist film 3 is 1 $\mu$m.

The resist film 3 contains a chemical amplification type resist as a component. The chemical amplification type resist used in the present invention includes, for example, polyhydroxy styrene (PHS) having an acetal protective group (see FIG. 7), PHS having t-BOC protective group, and polyvinyl phenol having the hydroxyl group within the polymer blocked by an alkyl group. It is also possible to use a novolak series resist prepared by mixing a dissolution inhibiting component with a novolak resin, in which the dissolution inhibiting component is decomposed and denatured by the catalytic action of the acid component ($H^+$) formed by light exposure so as to recover the solubility.

Then, the lid 74 is opened and the spin chuck 66 is moved upward. Further, the shutter is opened, and the holder 28a of the main transfer arm is inserted into the resist solution coating section 21, followed by moving the spin chuck 66 downward so as to transfer the wafer W from the spin chuck 66 onto the holder 28a. Then, the wafer W is retreated together with the holder 28a from within the resist solution coating section 21.

In the next step, the main transfer arm 28 transfers the wafer W into the first baking section 24 so as to dispose the wafer W on the hot plate 81. In the first baking section 24, the wafer W is heated to a predetermined temperature so as to evaporate the solvent from the resist film 3 and, thus, to stabilize the resist film 3 (step S5). Further, the main transfer arm 28 transfers the wafer W into a cooling section (not shown) so as to cool the wafer W to about room temperature (step S6).

After the cooling step, the main transfer arm 28 transfers the wafer W into the acidic solution coating section 22. In the acidic solution coating section 22, an acidic solution 4 is supplied onto the resist film 3, as shown in FIG. 6B (step S7). In this step, the acidic solution 4 is supplied while rotating the wafer W at a low speed so as to spread the acidic solution 4 uniformly over the entire surface of the wafer W. The acidic solution 4 is an aqueous solution containing 1 to 5% by weight of ethanesulfonic acid and is substantially equal in composition to a solution used in a top anti-reflective coating (TARC). Incidentally, TARC is used for preventing a surface reflection of the light used for the light exposure.

Step S7 can be performed by a spin coating method. The thickness of the acidic solution layer 4 is not particularly limited. Incidentally, it is possible to blow a mist or vapor of the acidic solution 4 against the resist film 3 in step S7.

Then, the main transfer arm 28 transfers the wafer W into the second baking section 25. In the second baking section 25, the wafer W is kept heated to 50 to 110° C. for 60 to 180 seconds (step S8). As a result, a surface region 31 of the resist film 3 is made soluble in an alkaline solution, as shown in FIG. 6C.

FIG. 7 shows the chemical reactions for converting the resist surface region 31 from an alkali-insoluble state into an alkali-soluble state.

As described previously, the main component of the resist film 3 is polyhydroxy styrene (PHS). Since PHS has an acetal protective group, the resist film 3 is insoluble in alkali. If the acidic solution is heated, $H^+$ within the acidic solution liberates the acetal group from PHS which is soluble in alkali. On the other hand, the liberated acetal group forms carbocation (1) represented by a resonance structure. Carbocation (1), which is an unstable intermediate product, is decomposed so as to newly generate $H^+$. The newly generated H+ is consumed for the succeeding decomposition so as to bring about a chain reaction for successively generating H+. The chain reaction for generating $H^+$ is dependent on the initial amount of H+ and on the heating conditions. It follows that it is possible to make a surface region alone of a desired thickness of the resist film 3 soluble in alkali. In step S8 of this embodiment, a surface region, which has a thickness of, for example, 0.5 µm, of the resist film 8 is made soluble in alkali.

In the next step, the main transfer arm 28 transfers the wafer W into a cooling section (not shown) so as to cool the wafer W to about room temperature (step S9). Further, the wafer W is rinsed in a rinsing section (not shown) (step S10) and, then, dried in a drying section (not shown) (step S11).

After the drying step, the main transfer arm 28 transfers the wafer W into the alkaline solution coating section 23. In the alkaline solution coating section 23, an alkaline solution 5 is supplied onto the resist film 3, as shown in FIG. 6D (step S12). In this step, the alkaline solution 5 is supplied while rotating the wafer W at a low speed so as to spread the alkaline solution 5 uniformly over the entire surface of the wafer W. It is possible to use, for example, a developing solution for developing the resist layer exposed to light as the alkaline solution 5. As a result, the resist surface region 31 soluble in alkali elutes into the alkaline solution 5 so as to make the resist film 3 thinner than the initial state, as shown in FIG. 6E. Then, the wafer W is rinsed in a rinsing section (not shown) (step S13), followed by drying the wafer W in a drying section (not shown) (step S14). Further, the wafer W is unloaded from the process section 20 by the main transfer arm 28 (step S15).

According to the experiment conducted by the present inventors, the resist removing rate (etch rate) in a single process was about 1,000 to 1,500 Å (100 to 150 nm). It follows that the thickness of the resist film 3 can be decreased from an initial thickness of 1 µm to a target thickness of 0.5 µm by repeating steps S7 to S14 several times. Incidentally, the thickness of the surface region 31 which is made soluble in alkali can be controlled by controlling the heating temperature and/or time in step S8 of the finally repeated process.

Incidentally, it is possible to dip the entire wafer in an alkaline solution vessel in step S12. Alternatively, the linear nozzle 51 shown in FIG. 4 can be used in step S12. In this case, the nozzle 51 is positioned close to the wafer, i.e., about 1 mm apart from the wafer, and the wafer is rotated while supplying an alkaline solution to coat the entire surface of the wafer with the alkaline solution. Further, it is possible to mount a plurality of nozzles to the apparatus shown in FIG. 2. In this case, these nozzles are switched in supplying the solutions 3, 4 and 5, respectively.

In the embodiment described above, the resist film 3 having a thickness of 0.5 µm can be formed on the wafer W. Incidentally, the method of the present invention can also be employed for forming a resist film on an LCD substrate as well as on the semiconductor wafer.

Let us describe a second embodiment of the present invention with reference to FIGS. 8 and 9A to 9C. Those portions of the second embodiment which overlap with the first embodiment are omitted in the following description.

Specifically, a loading step S21 to a cooling step S26 of the second embodiment are substantially equal to steps S1 to S6 of the first embodiment. As shown in FIG. 9A, a resist film 3 having an average thickness of 1 µm (target value) is formed on a surface of the wafer W. Then, the resist film 3 is coated with a solvent 8 of a low solubility, as shown in FIG. 9B (step S27). The solvent 8 of the low solubility consists of, for example, 85% by volume of isopropyl alcohol and 15% by volume of MMP (3-methoxymethyl propionate). The resist film 3 is coated with the solvent 8 by, for example, a spin coating method and, then, the coating is left to stand for, for example, 10 seconds. As a result, the surface region in a thickness of 2,000 Å (200 nm) of the resist film 3 elutes into the solvent layer 8. It follows that the thickness of the resist film 8 is decreased, as shown in FIG. 9C. In this embodiment, the thickness of the resist film 3 can be controlled by controlling the contact time between the solvent layer 8 and the resist film 3. Incidentally, a rinsing step S28 to an unloading step S30 of the second embodiment are substantially equal to the steps S13 to S15 of the first embodiment.

Figure 10:
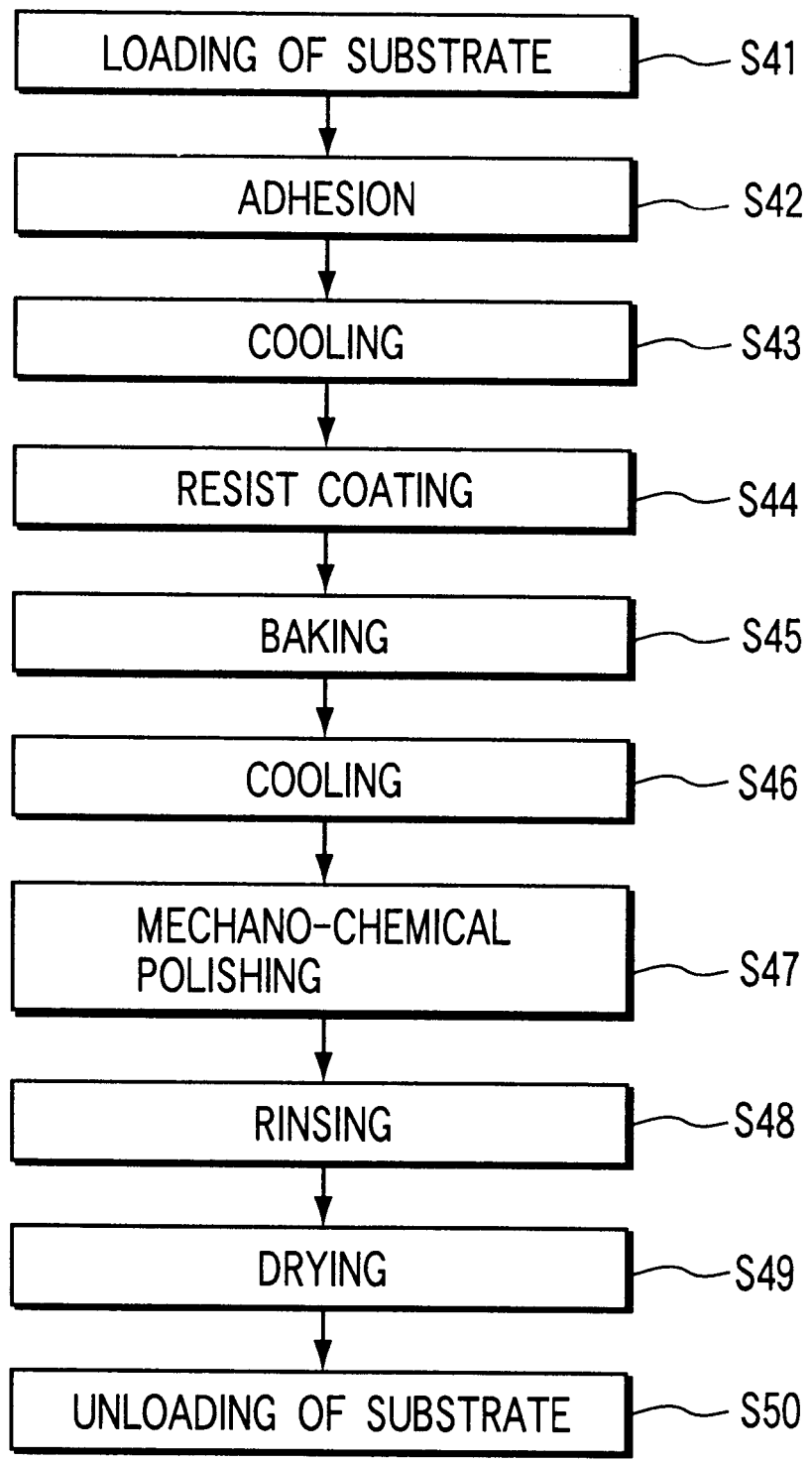
FIG. 10 is a flow chart showing a resist film forming method according to a third embodiment of the present invention.
Figure 11:
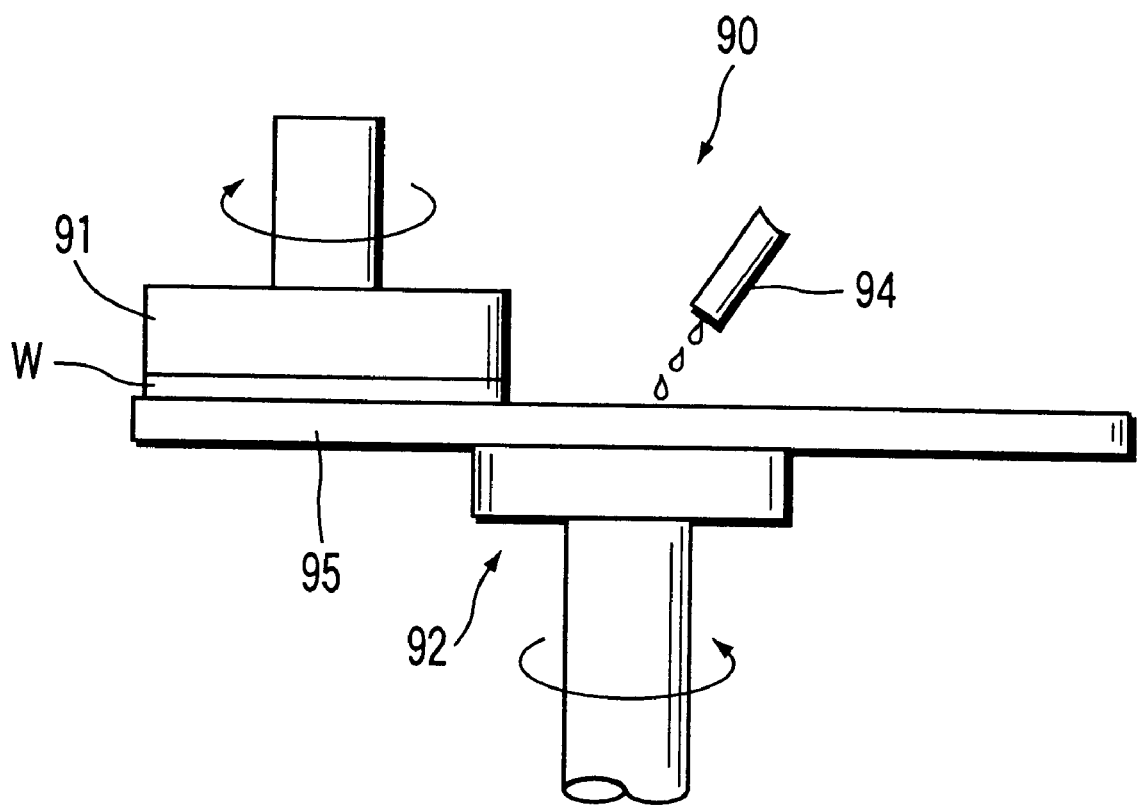
FIG. 11 schematically shows a chemical mechanical polishing apparatus (CMP apparatus).

Let us describe a third embodiment of the present invention with reference to FIGS. 10 and 11. Those portions of the third embodiment which overlap with the first embodiment are omitted in the following description.

Specifically, a loading step S41 to a cooling step S46 are substantially equal to the steps S1 to S6 of the first embodiment. If the resist film 3 having an average thickness of 1 µm (target value) is formed on a surface of the wafer W, the surface region 31 of the resist film 3 is mechanically and chemically removed by using a CMP apparatus 90 shown in FIG. 11 (step S47). In the CMP apparatus 90, the wafer W is held by a holding section 91 by vacuum suction with the resist film 3 formed on the wafer W facing downward. Also, the resist film 3 is pressed against a polishing plate 93 supported on a rotatable spinning disk 92. The surface region of the polishing plate 93 is formed of, for example, polyurethane. The wafer W is revolved about its own axis and, at the same time, is in contact with the rotating polishing plate 93 except the central portion of the polishing plate 93. Also, a polishing agent consisting of, for example, a colloidal silica, which is a weakly alkaline slurry containing silica as a main component, is supplied through a nozzle 94 onto the polishing plate 93. Naturally, the polishing agent is supplied into the clearance between the surface region 31 of the resist film 3 formed on the wafer W and the polishing plate 93, with the result that the surface region 31 of the resist film 3 is removed so as to decrease the thickness of the resist film 3. Incidentally, a rinsing step S48 to an unloading step S50 of the third embodiment are substantially equal to the steps S13 to S15 of the first embodiment.

As described above, the method of the present invention makes it possible to form a thin resist film on a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling a thickness of a resist film prior to a photolithographic exposure, comprising the steps of:
    (a) forming a resist film on a substrate; and
    (b) removing a surface region of the resist film formed in step (a) by:
        (i) applying an acidic solution to a surface of the resist film to make a surface region of the resist film soluble in alkali; and
        (ii) applying an alkaline solution to said surface to dissolve said surface region so as to decrease the thickness of the resist film; wherein (a) and (b) are carried out prior to photolithographically exposing said film to light.

2. The method according to claim 1, wherein a mechanochemical polishing treatment is applied in step (b) to the surface of the resist film for removing the surface region of the resist film by bringing a polishing member into contact with the surface of the resist film while supplying a chemical polishing agent onto the surface of the resist film, said polishing member being moved relative to the substrate.

3. The method according to claim 2, wherein a chemical polishing agent is supplied in step (b) onto the substrate while rotating the substrate.

4. The method according to claim 1, wherein a resist solution is supplied in step (a) onto the substrate while rotating the substrate.

5. The method according to claim 1, wherein an acid component is supplied in step (b) onto the substrate while rotating the substrate.

6. The method according to claim 1, wherein an acid catalyst reaction is brought about under heat by an alkali-reactive group, and the substrate is coated with a chemical amplification type resist in which the portion where the acid catalyst reaction has taken place is made soluble in alkali.

7. The method according to claim 1, wherein step (b) is repeated a plurality of times.

8. The method according to claim 1, wherein, in step (a), said forming comprises applying a chemically amplified resist solution on the substrate while the substrate is being rotated.

9. The method according to claim 1, wherein, before said removing, said resist film has an average thickness of 1 $\mu$m.

10. The method according to claim 1, wherein, after said removing,; the resist film has an average thickness of 0.5 $\mu$m.

11. The method according to claim 1, wherein said removing comprises etching at a single process etch rate of about 1,000 to 1,500 Å.

12. A method of controlling a thickness of a resist film prior to a photolithographic exposure, said method comprising the steps of:
  a first step of forming, on a surface of a substrate a chemically amplified resist film, which, when heated in the presence of an acidic solution, permits the acidic solution to be diffused so as to bring about an acid catalyst reaction in a surface region of said resist film and thereby make said region soluble in alkali;
  a second step of supplying the acidic solution to the surface of the resist film after said first step;
  a third step of heating the substrate so as to cause the acidic solution to bring about an acid catalyst reaction within the resist film to make the surface region of the resist film soluble in alkali; and
  a fourth step of supplying an alkaline solution onto the surface of the resist film so as to dissolve and remove the surface region of the resist film; wherein
    said first through fourth steps are carried out prior to photolithographically exposing said film to light.

13. The method according to claim 12, wherein said second to fourth steps are repeated a plurality of times.

14. The method according to claim 12, wherein said chemically amplified resist solution is supplied on the substrate while the substrate is being rotated in said first step.

15. The method according to claim 12, wherein, before said second step, the resist film has an average thickness of 1 $\mu$m.

16. The method according to claim 12, wherein said surface region has a thickness of 2000 Å.

* * * * *